United States Patent [19]
Campbell et al.

[11] Patent Number: 5,437,040
[45] Date of Patent: Jul. 25, 1995

[54] ELECTRONIC SYSTEM WITH VARIABLE THRESHOLD POWER FAILURE SIGNALING

[75] Inventors: William C. Campbell, Longmont; Barry O. Blair, Lafayette, both of Colo.

[73] Assignee: Codar Technology, Longmont, Colo.

[21] Appl. No.: 190,229

[22] Filed: Jan. 31, 1994

Related U.S. Application Data

[63] Continuation of Ser. No. 811,790, Dec. 20, 1991, abandoned.

[51] Int. Cl.⁶ .................. G08B 21/00; G06F 11/00
[52] U.S. Cl. .................. 395/750; 371/66; 307/22; 364/483; 361/78
[58] Field of Search .................. 395/750; 371/66; 307/22, 35, 64; 364/483, 431.11; 361/78

[56] References Cited

U.S. PATENT DOCUMENTS

| | | | |
|---|---|---|---|
| 4,077,061 | 2/1978 | Johnston et al. | 364/483 |
| 4,122,359 | 10/1978 | Breikss | 307/64 |
| 4,234,920 | 11/1980 | Van Ness et al. | 395/575 |
| 4,327,298 | 4/1982 | Burgin | 395/750 |
| 4,381,457 | 4/1983 | Wiles | 307/64 |
| 4,388,706 | 6/1983 | Butler | 365/229 |
| 4,415,853 | 11/1983 | Fisher | 324/74 |
| 4,485,456 | 11/1984 | Toyoda | 395/750 |
| 4,489,394 | 12/1984 | Borg | 395/750 |
| 4,611,289 | 9/1986 | Coppola | 395/750 |
| 4,642,616 | 2/1987 | Goodwin | 340/654 |
| 4,658,204 | 4/1987 | Goodwin | 323/285 |
| 4,703,191 | 10/1987 | Ferguson | 307/64 |
| 4,742,424 | 5/1988 | Kautzer et al. | 361/78 |
| 4,750,040 | 6/1988 | Hakamada | 365/229 |
| 4,818,891 | 4/1989 | Drinkwater | 307/64 |
| 4,823,280 | 4/1989 | Mailandt et al. | 364/483 |
| 4,884,242 | 11/1989 | Lacy et al. | 365/229 |
| 4,985,804 | 1/1991 | Campbell et al. | 361/384 |
| 5,105,182 | 4/1992 | Shindo | 340/663 |
| 5,283,792 | 2/1994 | Davies, Jr. et al. | 371/66 |

*Primary Examiner*—Allen R. MacDonald
*Assistant Examiner*—George Davis
*Attorney, Agent, or Firm*—Dilworth & Barrese

[57] ABSTRACT

A digital electronics system, such as a computer, includes circuits which provides signals proportional to the instantaneous voltage and current on the power bus to a microprocessor. The microprocessor uses these signals, the capacitance of the system filter capacitors, and the desired time for the system voltage to remain above a minimum voltage, to calculate an instantaneous voltage threshold. When the power bus voltage falls below this threshold voltage, the microprocessor provides a signal warning of impending power failure. The product of the voltage and current, i.e. the instantaneous system power, is displayed on an alphanumeric LED on the front panel of the computer.

20 Claims, 7 Drawing Sheets

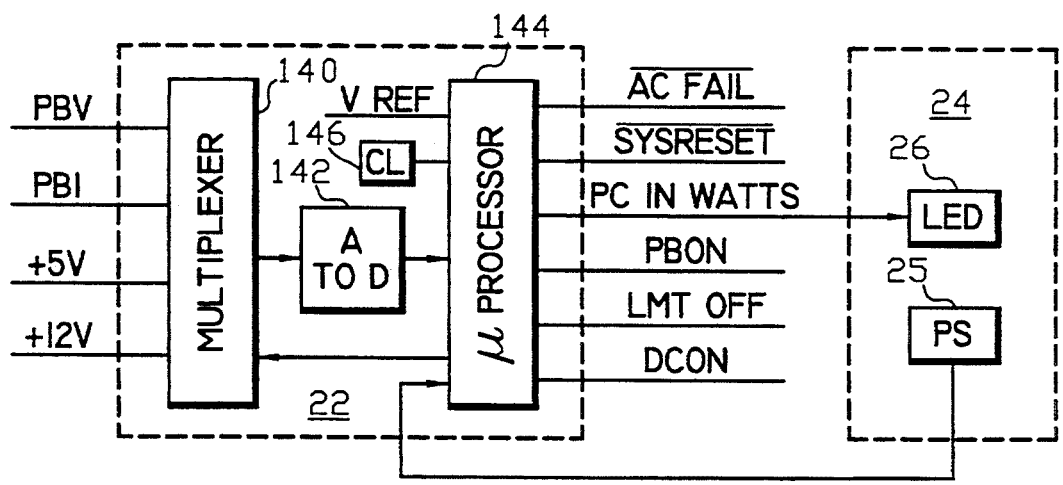
*FIG.5*
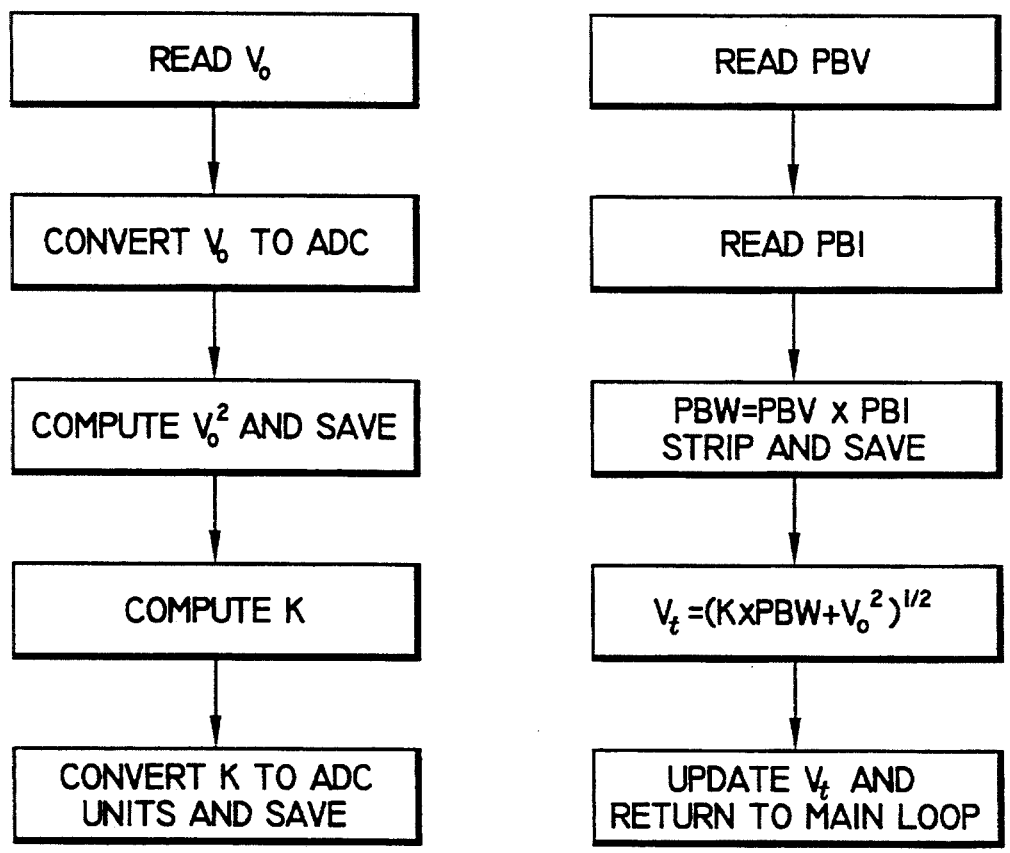
*FIG.6A*  *FIG.6B*

ELECTRONIC SYSTEM WITH VARIABLE THRESHOLD POWER FAILURE SIGNALING

This application is a continuation, of application Ser. No. 07/811,790, filed on Dec. 20, 1991, now abandoned.

BACKGROUND OF THE INVENTION

1. Field of the Invention

The invention in general relates to electronic systems having a power failure monitoring function and more particularly to such a system that in a single parameter takes into account all the significant elements that relate to power failure monitoring.

2. Statement of the Problem

It is well-known that some electronic systems, particularly digital electronic systems such as computers, may be adversely affected by loss of power during operation. The adverse affects may include loss of important data from volatile storage and the introduction of errors. Thus such electronic systems often include a power monitor that signals the system when power loss is impending, allowing the system to accomplish certain housekeeping tasks and store critical information in non-volatile RAM, for example. In order for these tasks to be accomplished before power failure, such systems must include some power storage means that allows the power to hold up for a time before it fails. Generally, in digital computer systems that utilize external AC power which is converted to internal DC power by a suitable power supply, the monitoring means is included in the power supply and provides at least 4 milliseconds warning between the time the AC power fails and the time the DC output drops below a value where the adverse consequences occur. In such systems sufficient power is stored in the power supply filter capacitors to maintain the voltage above the critical value for the critical time. See for example U.S. Pat. No. 4,985,804 issued to W. Carroll Campbell et al. which discloses a monitoring means that senses when the AC input voltage drops below a threshold voltage. U.S. Pat. No. 4,658,204 issued to Peter A. Goodwin discloses that some prior art devices monitor the load voltage rather than the AC input voltage. This patent also discloses monitoring for a saturated state in the feedback control circuit in a regulated power supply. A problem with such a simple threshold voltage or saturation approach is that the monitor may detect short outages of power and signal the computer that power failure is imminent, which disrupts the operation of the computer, when, in actuality, the power supply would have been capable of maintaining operation of the computer with no disruption during the outage.

The computer system disclosed in U.S. Pat. No. 4,985,804 referenced above overcomes the above problem to some extent by signaling impending power failure only when the power drops below the threshold voltage for a certain number of half-cycles, which number of cycles can be varied manually, depending on the anticipated load of the system, by use of a potentiometer. Thus this prior art system allows matching of the monitoring to the load, which is a significant factor in determining how long the DC power will last after AC power is lost. However, there still remain problems with this approach. The first is that knowledge of the load is required, which may vary greatly for any given computer configuration. Thus one is forced to assume a worst-case condition of full load on the power supply. The second problem is that the hold-up time decreases significantly as the AC line voltage just prior to power loss is lowered, and thus one is forced to assume a low AC line condition. Applying both these conditions results in greatly reduced ability to coast through power outages.

Another approach to providing assured sufficient warning of impending power failure with ability to coast through short power outages is disclosed in U.S. Pat. No. 4,742,424 issued to Jeffrey A. Kautzer et al. This system uses a charge/discharge model that upon AC power failure estimates the time left before the power falls below an acceptable level. The disclosure indicates that the load may be estimated by sensing on/off conditions of system elements or measuring the current provided by the DC power supply, and using this to change the rate of count in a counter in the charge/discharge model or by inhibiting one or more logic elements for changing division ratios in the counter, though it does not go into details of how this would be implemented. While this charge/discharge model appears to take into account the significant parameters that relate to the energy in the system, i.e. the voltage, the energy storing capacity, and the load, the device disclosed is relatively complex and at best can only give an estimate of the time left before decay based on a model that only approximates the computer system. It would be very useful to have a system that takes into account the actual values of the voltage, current and energy storage ability, e.g. capacitance, of the system prior to the initiation of the warning signal, and does this using a single, easily measurable parameter of the electronic system.

Another aspect of the timely warning versus coast through problem is that different electronic systems generally require differing amounts of time to perform the operations necessary prior to power outage. As indicated above, U.S. Pat. No. 4,985,804 provides some solution to this problem in that the number of half-cycles over which the voltage may remain below the threshold, and thus the warning time can be adjusted by a potentiometer. Similarly, U. S. Pat. No. 4,742,424 discloses a plurality of threshold detector circuits that provide different lengths of warnings. In the former case the adjustment must be made manually, and in the latter case, each separate time requires a separate threshold detector circuit, which is relatively expensive. Both solutions offer only a limited number of different warning times. U.S. Pat. Nos. 4,122,359 issued to Ivars P. Breikas, 4,381,457 issued to James P. Wiles, and 4,818,891 issued to Don L. Drinkwater, disclose other solutions to the problem of providing coast-through ability for almost any system. These disclose a backup battery, an auxiliary power supply, and a power booster to permit the system to make it through loss of power. Other devices have shown the use of a capacitor for the same purpose. However, all these solutions are relatively complex and expensive. It would be highly useful to have a electronic system in which any desired length of warning could be easily provided.

Providing a display of power consumed by an electrical system is and old and crowded art. See for example U.S. Pat. No. 4,415,853 issued to Berish M. Fisher. However, up until now, no one has provided such a display on a computer, and no one has shown a simple and inexpensive way of providing such a display in a computer.

3. Solution to the problem

The present invention provides an electronic system having a power failure monitoring function that, like some of the simplest of the prior art power failure monitoring devices, uses a threshold of a single parameter of the system to trigger the power failure warning signal, however, unlike prior art systems, the threshold is a variable one.

The present invention provides an electronic system having a power failure monitoring function employing a variable threshold which can easily be calculated on the fly (in real time) and takes into account the significant properties of the system that effect the length of time that the energy in the system will sustain the functions necessary for orderly power down.

The invention further provides such a system in which actual, current values of the significant properties are used in calculating the threshold, and thus the threshold accurately reflects the state of the system at the time of power loss.

The invention also provides such a system in which the desired time prior to the power falling below an acceptable level is also factored into the threshold.

The invention thus provides a method and apparatus which optimizes the ability of a computer to ride through power outages without risking premature loss of power.

In addition, the invention provides a computer in which the actual system load power, which is calculated and used in determining the variable threshold, is displayed on the front panel of the computer. This information has been found to be highly useful in determining, for example, whether more computer cards can be added into the backplane without overloading the power supply, determining power source requirements, and determining cooling requirements.

SUMMARY OF THE INVENTION

The invention provides an electronic system having a power failure monitoring function, the system comprising: voltage monitoring means for monitoring a system voltage; threshold voltage means for providing a variable threshold voltage which depends on a variable parameter of the system; comparison means for periodically comparing the system voltage to the variable threshold voltage; and signal means for providing a signal indicative of an impending power failure when the system voltage is less than the variable threshold voltage. Preferably, the variable parameter is the power, current, or voltage being used by the system. Preferably, the system further includes a DC power supply having one or more filter capacitors, and wherein the threshold voltage takes into account the energy stored in the one or more filter capacitors. Preferably, the threshold voltage takes into account the time it is desired for the system voltage to stay above a predetermined voltage after power failure.

In another aspect the invention provides a computer system having a power failure monitoring function, the computer system comprising: a digital memory; a digital processor communicating with the digital memory; parameter monitoring means for monitoring a system parameter; threshold means for providing a variable threshold which depends on an instantaneous condition of the computer system; comparison means for periodically comparing the system parameter to the variable threshold; and signal means responsive to the comparison means for providing a signal indicative of an impending power failure. Preferably, the computer system further comprises a DC power bus, and the variable threshold depends on the current on the DC power bus. Preferably, the variable threshold depends on the voltage on the DC power bus. Preferably, the computer system further includes a DC power supply having one or more filter capacitors, and wherein the variable threshold takes into account the energy stored in the one or more filter capacitors. Preferably, the variable threshold takes into account the time it is desired for the system voltage to stay above a predetermined voltage after power failure.

In a further aspect, the invention provides a computer system comprising: a digital memory; a digital processor communicating with the digital memory; power measuring means for measuring the power being used by the computer system; and display means responsive to the power measuring means for displaying the instantaneous power being used by the computer system. Preferably, the computer system includes a DC power bus and the power measuring means comprises means for measuring the voltage on the DC power bus. Preferably, the power measuring means comprises means for measuring the current on the DC power bus. Preferably, the display means comprises means for displaying the power in watts. Preferably, the computer includes a housing and the display means comprises an LED display mounted on the housing.

In still another aspect, the invention provides a method of providing a power failure anticipatory function in an electronics system comprising the steps of: monitoring a system parameter; measuring an instantaneous condition of the electronics system; calculating a variable threshold using the measured instantaneous condition; comparing the system parameter to the variable threshold; and providing a signal indicative of an impending power failure when the step of comparing so indicates. Preferably, the electronics system includes a computer electronics assembly having a power bus and the step of measuring comprises measuring the voltage on the power bus. Preferably, the instantaneous condition is the current on the power bus. Preferably, the step of calculating comprises calculating a variable threshold voltage which depends on the time it is desired for the system voltage to stay above a predetermined voltage after power failure.

The term "instantaneous" when used herein means instantaneous as compared to the typical response times of a human being. The invention not only provides information on the instantaneous voltage, current, energy capacity, and power being used by the electronic system in a single variable parameter, but in addition the parameter is the system voltage which is perhaps the easiest of all system parameters to measure and handle electronically. Further, the instantaneous power calculated in determining the variable threshold, can be displayed on the front panel and has been found to be extremely helpful, after one becomes familiar with it, to head off problems and to provide information that is very useful in troubleshooting. Numerous other features, objects and advantages of the invention will become apparent from the following description when read in conjunction with the accompanying drawings.

BRIEF DESCRIPTION OF THE DRAWINGS

FIG. 5 is a block diagram showing relevant elements of the power control module and front panel in FIG. 1;

FIG. 6A is a flow chart showing details of the initialization of variables and tables function in the system of FIG. 1, which initialization function is referred to in FIG. 7A below;

FIG. 6B is a flow chart showing details of the recomputation of $V_t$ in the system of FIG. 1, also referred to in FIG. 7A;

DESCRIPTION OF THE PREFERRED EMBODIMENT

1. Overview

Figure 1:
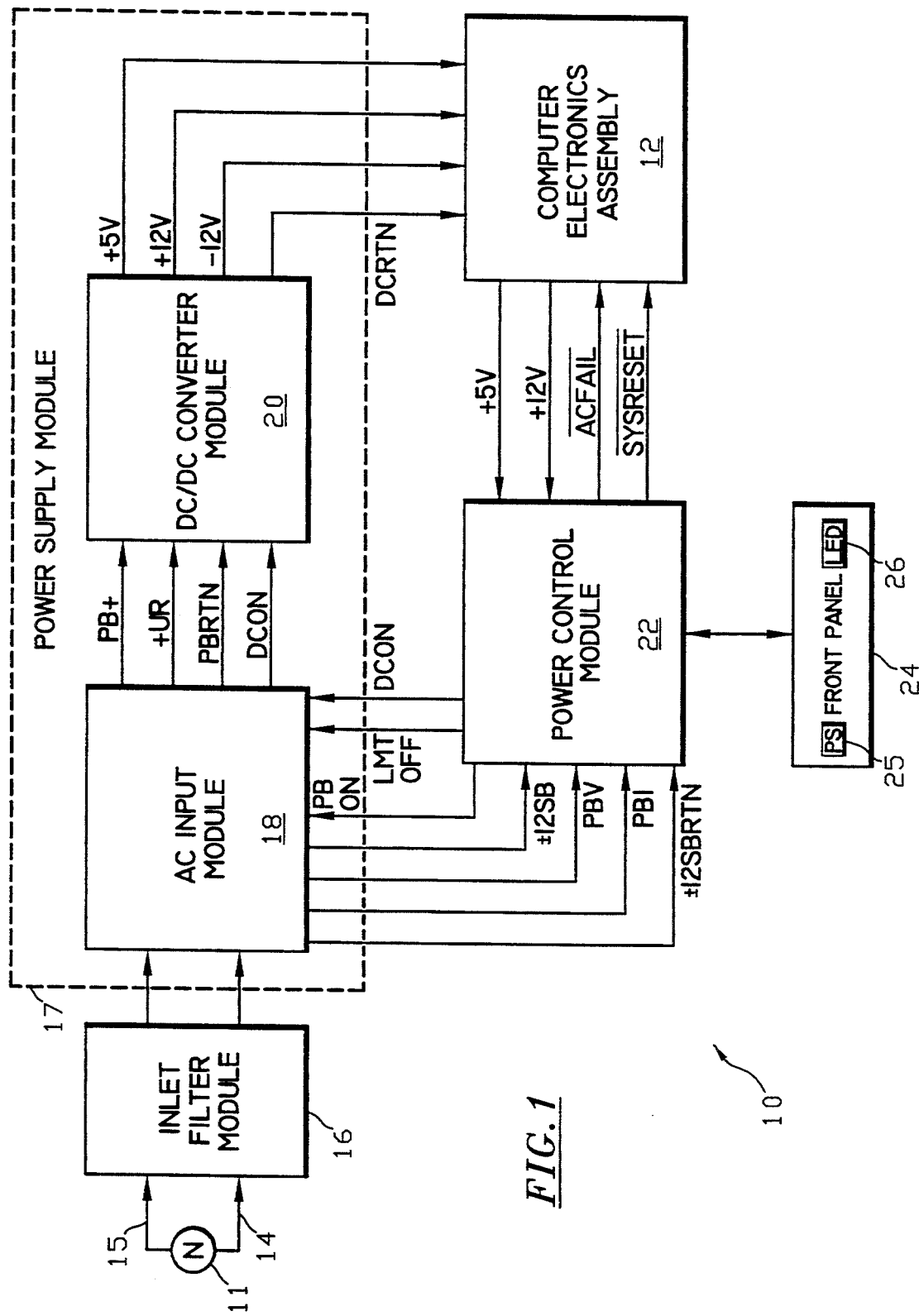
FIG. 1 is a block diagram showing the relevant components of the preferred embodiment of an electronic system according to the invention.

Turning now to FIG. 1 a block diagram of the preferred electronics system 10 according to the invention is shown. The preferred electronics system 10 is a ruggedized computer system 10 which includes a computer electronics assembly 12, a filter inlet module 16, a power supply 17, a power control module 22, and a computer front panel 24 having a power switch 25 and an LED display 26 for displaying the power consumed by the computer electronics assembly 12. The computer 10 receives power from an AC power source 11 via power lines 14 and 15. Noise is filtered out in inlet filter module 16 and the power applied to power supply 17 comprising AC input module 18 and DC/DC converter module 20. The AC input module 18 rectifies the AC power and applies DC power to the DC/DC converter module 20 on the lines PB+ (power bus positive) and PBRTN (power bus return). These two power bus lines, PB+ and PBRTN, provide the power which is used by the computer electronics assembly 12 after conversion to appropriate 5 volt, +12 volt, and −12 volt power levels by DC/DC converter module 20. AC input module 18 also applies a low power voltage, UR, to DC/DC converter module 20 which is used internally by the module to power certain of its components. AC input module 18 also produces +12 V and −12 V standby voltages any time it is connected to line current; that is, even when the computer power switch 25 is switched to off. This +12 V and −12 V standby power is applied to the power control module 22, which controls the system power.

The power control module 22 is on whenever the electronics system 10 is connected to an AC power source 11. During times when power switch 25 is off or when power has failed the /ACFAIL and /SYSRESET signals are applied to computer electronics assembly 12 by power control module 22. When power control module 22 receives an indication from front panel 24 that the computer electronics assembly 12 should be powered on, it applies the PBON (Power Bus On) signal to the AC input module 18 which applies power to the power bus PB+ through current limiting resistors 89 and 102 (FIG. 3), which causes filter capacitors 87 and 88 (FIG. 3) to begin charging and the PBV signal to begin to rise. The PBV signal is proportional to the power bus voltage and is applied to the power control module 22. A PBI signal, which is proportional to the current on the power bus, is also applied to the power control module 22 by the AC inlet module. When the PBV signal is close to its final value, the LMTOFF (Limiter Off) signal is applied to the AC inlet module 18 by power control module 22, which signal causes the module 18 to short the inrush current limiting resistors 89 and 102 and allows full current to be applied to the filter capacitors 87 and 88. At this time there will be approximately 325 VDC across PB+ and PBRTN. Now the power control module 22 applies the DCON (Direct Current On) signal to the AC inlet module which passes it unchanged to the DC/DC converter module 20, which thereupon switches on the voltages required by computer electronics assembly 12, which are +5 V, +12 V and −12 V in the preferred embodiment. The power control module 22 monitors the 5 V and +12 V voltages on the backplane of the computer electronics assembly 12. When these voltages reach their nominal values, the power control module 22 drops the /ACFAIL and /SYSRESET signals which cause the computer electronics module to begin executing instructions. This completes the power on sequence.

Figure 3:
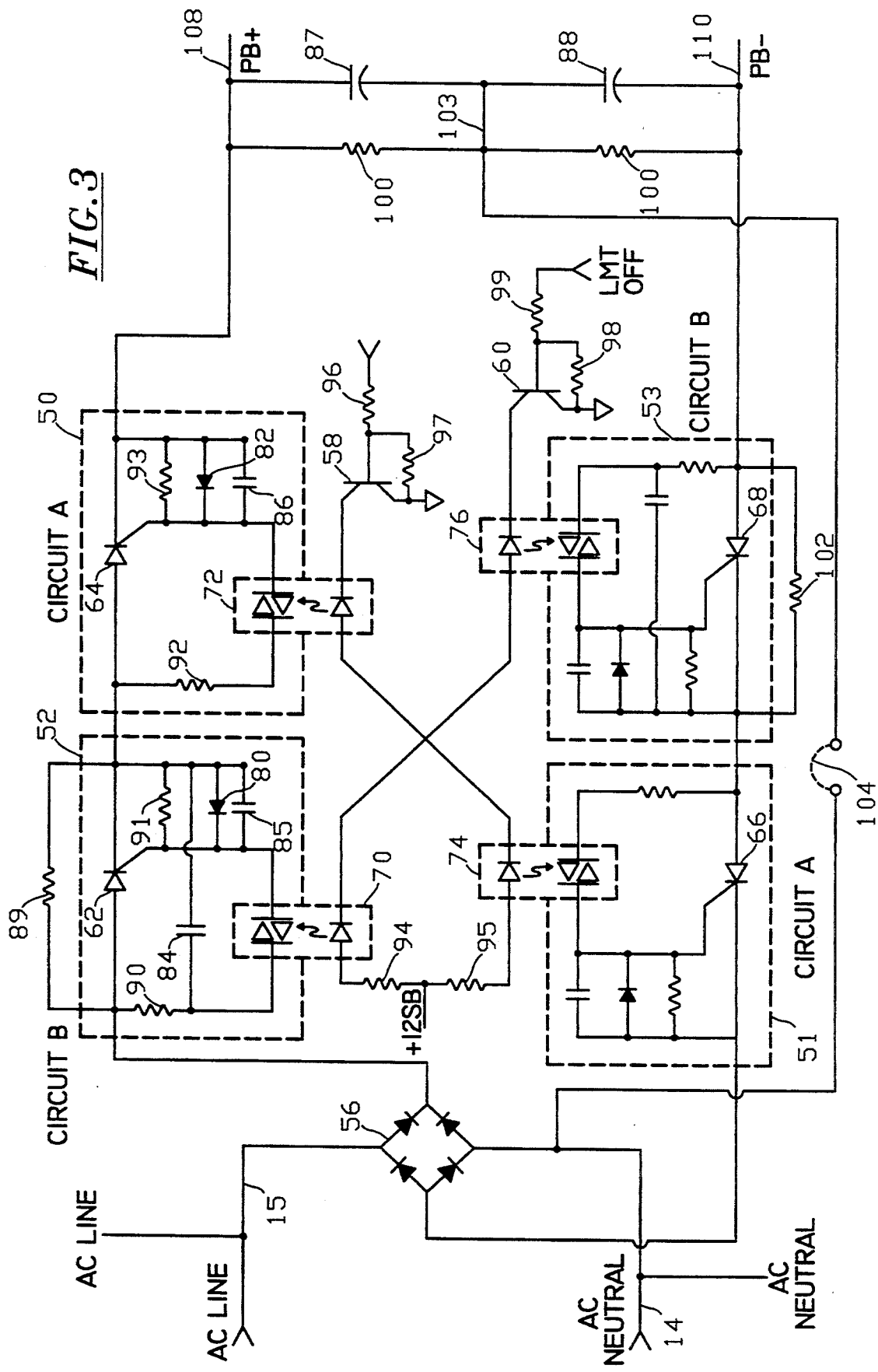
FIG. 3 is a detailed circuit diagram of the power train in the AC input module of FIG. 1.

While the computer electronics module is on, about every 42 milliseconds the power control module 22 calculates a power bus threshold voltage $V_t$. This power bus threshold voltage is found from the following analysis. The primary energy storage elements in the power supply 17 are the filter capacitors 87 and 88 (FIG. 3). The energy (work) stored in the capacitors 87 and 88 is given by:

$$W = 0.5\, C\, V^2$$

where W is the energy in joules, C is the equivalent capacitance of capacitors 87 and 88 in farads, and V is the voltage across the capacitors. The DC/DC converter 20 has some minimum value of voltage beyond which it will not function correctly, which voltage we call $V_0$. Thus the useable energy, $W_u$, stored in the power supply is $$W_u = 0.5\, C\, V^2 - 0.5\, C\, V_0^2 - 0.5\, C(V^2 - V_0^2).$$

The power used by the DC/DC converter and it load is given by $$P = V\, I$$

where P is the power in watts, V is the voltage across the capacitors, and I is the current into the DC/DC converter. As we shall see below, both V and I are measured by the circuit of FIG. 4. Since $$W = P\, t,$$

where t = time, we may write:

$$t_h = W_u / P = 0.5\, C\, (V_t^2 - V_0^2)/P$$

where $V_t$ is the threshold voltage that gives the desired hold up time $t_h$. Solving this equation for $V_t$, yields the equation:

$$V_t = (2 t_h \times V \times I / C + V_o^2)^{0.5}$$

where $t_h$ is a desired time for the power to remain at acceptable levels to permit the computer electronics assembly to complete its power down operations, V is the voltage PB+ on the power bus, I is the current on the power bus, C is the equivalent capacitance of filter capacitors 87 and 88, and $V_o$ is the minimum voltage at which DC/DC converter 20 will function correctly.

The variable $t_h$ is chosen to give the desired anticipation of power failure required by the computer, plus any circuit delays and margin required. C and $V_0$ are dependent on the power supply and are constants for a given system. V and I are measured, and thus $V_t$ may be calculated by power control module 22. $V_t$ is thus the voltage at which the system must signal the computer that a power supply is imminent. It is a feature of the invention that this threshold voltage, $V_t$, is based on the DC power bus voltage, and thus will be relatively unaffected by varying AC line voltages. Further, the product $V \times I$ is relatively independent of V and essentially depends only on the load and efficiency of DC/DC converter 20.

About every 142 milliseconds while the computer electronics assembly is on, the power being drawn by the computer electronics assembly 12, which is the product $V \times I$ calculated when calculating $V_t$, is output by computer control module 22 in ASCII code to LED display 26 on front panel 24 which displays the power in watts.

When the AC power fails, the signal PBV will begin to drop as energy is drained from filter capacitors 87 and 88. The power control module 22 monitors this signal, and when it indicates that V is less than or equal to $V_t$, the power control module 22 starts the power-down sequence by applying /ACFAIL to the computer electronics assembly 12. Computer electronics assembly 12 responds to this signal by saving critical information in volatile RAM to non-volatile memory and doing whatever else is necessary for orderly power-down. A fixed time after the /ACFAIL signal is asserted, typically 4 ms, the power control module 22 applies the /SYSRESET to computer electronics module 12. After this time the DC power to the computer electronics assembly 12 will begin to fail and the power-down sequence is over.

2. Description of Circuits

Figure 2:
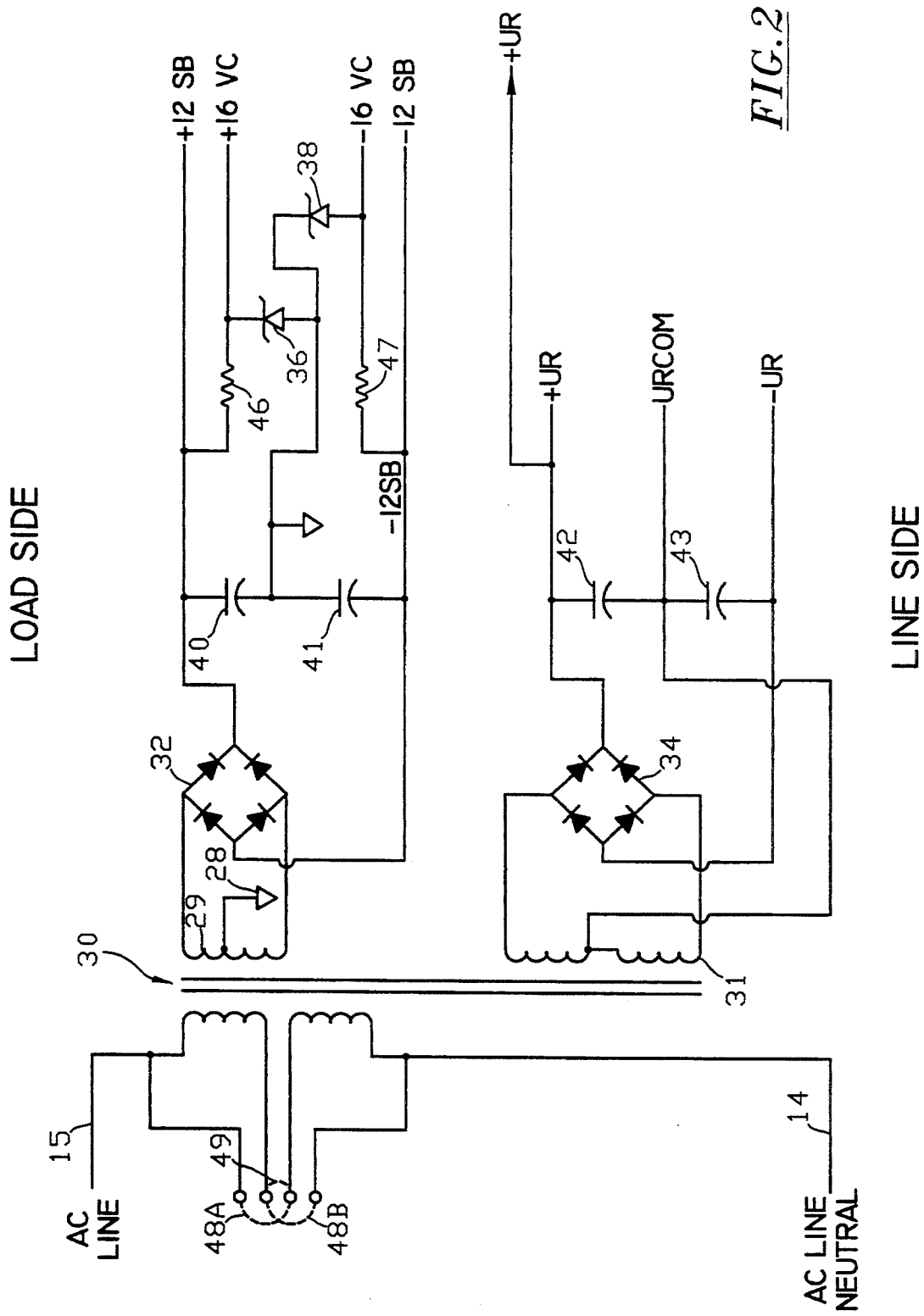
FIG. 2 is a detailed circuit diagram of the standby power supplies in the AC input module of FIG. 1.
Figure 4:
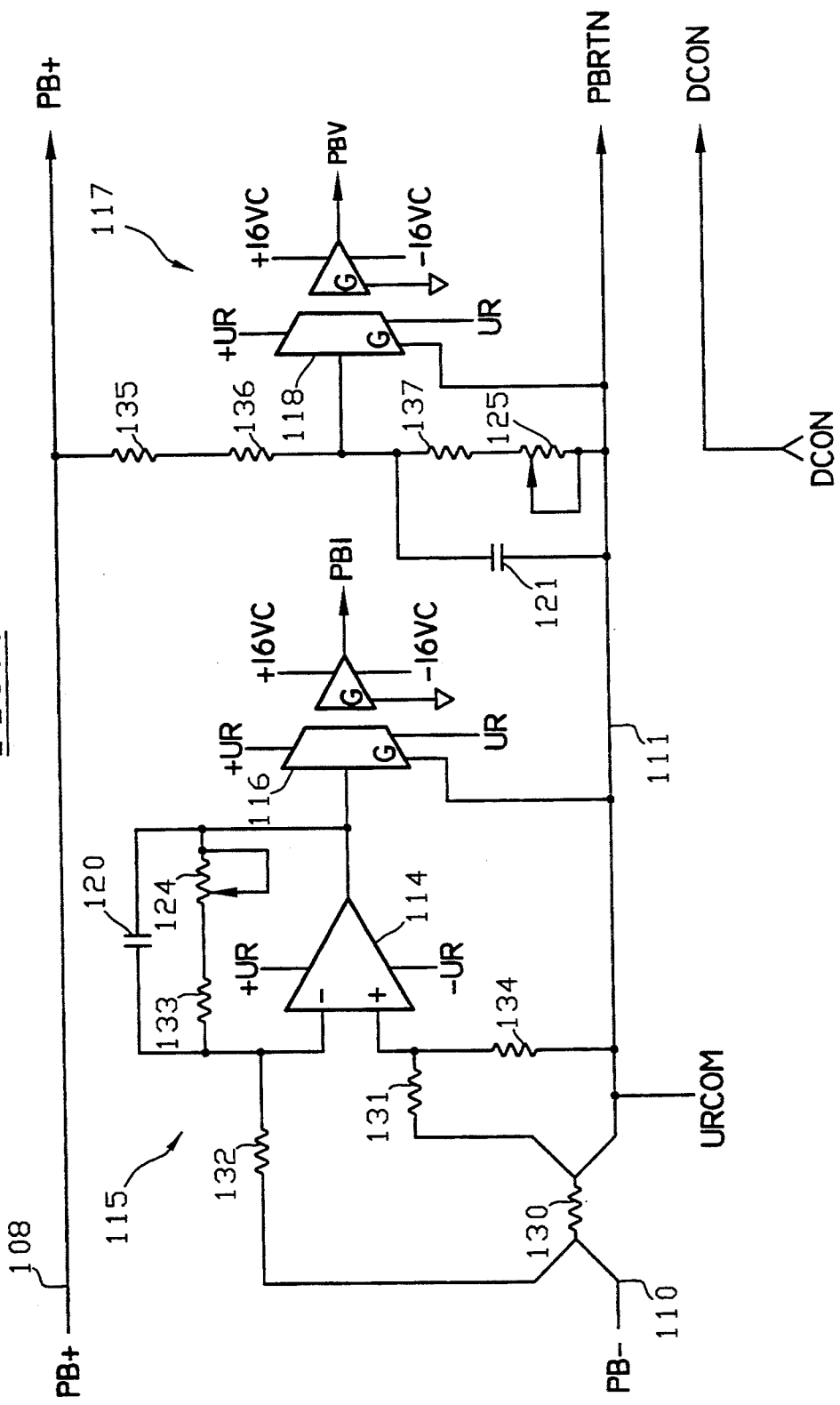
FIG. 4 is a detailed circuit diagram of the voltage and current sensing circuits in the AC input module of FIG. 1.

Turning now to a more detailed description of the invention, the detailed electronic circuit of the AC input module 18 is shown in FIGS. 2, 3, and 4. FIG. 2 shows the standby power supply. There are two parts to this supply, one shown generally in upper portion of the figure is designated as the "load side" supply as it is referenced to the load ground, and a second shown generally in the lower portion of the figure is designated as the "line side" supply as it is referenced to the line side ground. It is noted that a triangle such as at 28 indicates connection to the load side ground. The standby supply includes transformer 30 which supplies both the load side and the line side. Jumpers 48A and 48B configure the primary of transformer 30 for 120 VAC operation while jumper 49 configures the primary for 240 VAC operation. The load side comprises secondary 29, full wave bridge rectifier 32, Zener diodes 36 and 38, capacitors 40 and 41, and resistors 46 and 47. Voltage received by secondary 29 is rectified by rectifier 32 and filtered by capacitors 40 and 41. Capacitor 40 is larger than capacitor 41 because there is more load on the positive supply than the negative. The load side supply produces two sets of unregulated voltages: ±12 SB and ±16 VC. The first powers the power control module 22 and some of the circuitry of the AC input module 18. The second powers circuitry only in the AC input module. The ±16 VC voltage is derived from the ±12 SB voltage and is clamped at 16 V by Zener diodes 36 and 38. Resistors 46 and 47 limit the current when the Zener's clamp, which prevents the voltage from going too high during conditions of high AC line voltage. The line side standby power supply comprises split secondary 31, full wave bridge rectifier 34, and capacitors 42 and 43. AC voltage is received on secondary 31, rectified by rectifier 34 and filtered by capacitors 42 and 43 to produce the voltages ±UR. These voltages power low voltage devices referenced to the line side on both the AC input module 18 and the DC/DC converter module 20.

The power train is shown in FIG. 3. This power train generates the DC power that is converted by converter 20 and used by computer electronics assembly 12. The power train circuit includes two pairs of identical circuits: circuits 50 and 51 which are labeled as "Circuit A"; and circuits 52 and 53 which are labeled "Circuit B". In the discussion below, the details will be given only for circuits 50 and 52, since the details of 51 and 53, respectively, will be the same. The power train comprises full-wave bridge rectifier 56, npn transistors 58 and 60, SCRs 62, 64, 66, and 68, opto-triacs 70, 72, 74, and 76, diodes 80 and 82, capacitors 84, 85, 86, 87, and 88, resistors 89 through 102, and jumper 104. The AC power source 11 (FIG. 1) is connected across rectifier 56 via lines 14 and 15. The positive output of rectifier 56 is connected to the anode of SCR 62. Resistor 89 is connected across the anode and cathode of SCR 62. Resistor 90 is connected across the anode and gate of SCR 62 through the triac of opto-triac 70. The line between resistor 90 and triac 70 is connected to the cathode of SCR 62 through capacitor 84. Resistor 91, diode 80, and capacitor 85 are connected in parallel across the gate and cathode of SCR 62. The cathode of SCR 62 is connected to the anode of SCR 64. Circuit 50, with respect to SCR 64, is the same as circuit 53, with respect to SCR 62 except it does not include the equivalents of resistor 89 and capacitor 84. The cathode of SCR 64 provides the positive power bus voltage PB+. The negative output of rectifier 56 is connected to the cathode of SCR 66. The anode of SCR 66 is connected to the cathode of SCR 68. Resistor 102 is connected across the cathode and anode of SCR 68. The anode of SCR 68 provides the negative power bus voltage PB−. Resistor 100 and capacitor 87 are connected in parallel between line 103 and the PB+ line, while resistor 101 and capacitor 88 are connected in parallel between line 103 and the PB− line. The +12 V standby power is applied to the anodes of the LEDs of opto-triacs 70 and 74 through resistors 94 and 95 respectively. The cathodes of the LEDs of opto-triacs 70 and 74 are connected to the anodes of the LEDs of opto-triacs 76 and 72 respectively. The cathodes of the LEDs of opto-triacs 72 and 76 are connected to the collectors of transistors 58 and 60 respectively. The emitter of each of transistors 58 and 60 is connected to ground, and the base and emitter of each are connected through resistors 97 and 98 respectively. The base of transistor 58 is connected to the PBON signal line through resistor 96, while the base of transistor 60 is connected to the LMTOFF signal line through resistor 99. Jumper 104 is optionally connected between the AC neutral line and line 103.

Anytime AC power is available, it is rectified by rectifier 56 and the +12 Sb voltage is applied to the LEDs of opto-triacs 70, 72, 74, and 76. These opto-triacs act as optical switches for the SCRs 62, 64, 66, and 68. To turn the power on, the power control module 22 asserts the PBON signal by raising it to a nominal 5 volts. This turns on transistor 58 through current limiting resistor 96 with resistor 97 providing noise immunity. When transistor 58 turns on, its collector approaches ground, which pulls current through the LEDs of opto-triacs 72 and 74 in both the "A" circuits. This current is limited by resistor 95. The turning on of the current in the LEDs of opto-triacs 72 and 74 turns on SCRs 64 and 66 respectively. This permits current to flow from rectifier 56 through current-limiting resistor 89 through SCR 64 and into filter capacitor 87. The other side of capacitor 87 may be either returned through jumper 104, which is inserted for 120 VAC operation, or through the other filter capacitor 108 when jumper 104 is not inserted, that is, for 240 VAC operation. Likewise, filter capacitor 108 is charged via circuit 51.

When jumper 104 is in, the configuration is that of a full-wave doubler. When jumper 104 is removed, the configuration is that of a full-wave bridge. Thus, with either 120 VAC and the jumper 104 inserted or for 240 VAC and the jumper not inserted, the resulting voltage across the capacitors 87 and 88 is the same: about 325 VDC. Bleeder resistors 100 and 101 serve to discharge capacitors 87 and 88 respectively when power is turned off, for safety reasons.

When the voltage across filter capacitors 87 and 88 reaches a value such that excessive inrush of current is no longer a problem, the power control module 22 asserts the LMTOFF signal. This signal turns on transistor 60 in the same manner as previously described with reference to transistor 58 and the PBON signal. This switches on the opto-triacs in the "B" circuits 52 and 53, which causes the SCRs 62 and 68 to conduct, and shorts the current-limiting resistors 89 and 102. Current now flows unimpeded to the filter capacitors 87 and 88.

While the filter capacitors 87 and 88 are charging, the "A" circuits operate as will be described in the following for circuit 50. Since the current in SCR 64 is pulsating, it must be triggered on every cycle to keep it conducting. When the opto-triac 72 is turned on, it allows current to flow through resistor 92 to the gate of SCR 64 to turn it on. Resistor 93 and capacitor 86 provide filtering on the gate to prevent SCR 64 from being inadvertently triggered. Diode 82 prevents the gate of SCR 64 from going negative with respect to the cathode when the current attempts to flow in the reverse direction, and it serves the same function in the event of a component failure somewhere in the power train: A negative gate voltage of too large a value can damage the SCR. Diode 82 also provides a path for the reverse recovery current required by the diodes in bridge 56 at the time of reverse current flow, since the opto-triac is always on.

Circuit B is identical to Circuit A with two exceptions: the opto-triac 70 is of a different type than the opto-triac 72, and there is an additional capacitor 84. Opto-triac 70 incorporates a zero voltage crossing circuit that only allows the triac to be switched on when the voltage across it crosses zero. This zero voltage crossing circuit is desirable in limiting the final surge current into the filter capacitor 100 when the current limiter resistor 89 is shunted. This zero voltage crossing function would be desirable in Circuit A also, but it would not function there because of the absence of a resistor equivalent to resistor 89, which in addition to its current limiting function acts as a shunt for Circuit B. Absence of this resistor prevents the voltage from being zero when input voltage is applied, and so the zero voltage crossing circuit would never permit the opto-triac 72 to turn on. Capacitor 84 serves to limit high rate-of-rise voltages, dv/dt, that can cause unintentional firing of opto-triac 70 and subsequent firing of SCR 62. High dv/dt can be caused by plugging the system into the AC power source 11, tripping on a circuit breaker, or noise on the AC poser line. Without the protection of capacitor 84, such events could result in voltage on the filter capacitors 87 and 88 when the power supply is supposedly off. This resistance to high dv/dt is further enhanced by the fact that the zero voltage crossing circuit in opto-triac 70 has a dv/dt rating of 2000 Volts/microsecond as compared to a rating of 10 Volts/microsecond in opto-triac 72.

The circuit for sensing the power bus voltage and current is shown in FIG. 4. It includes operational amplifier 114, isolation amplifiers 116 and 118, capacitors 120 and 121, potentiometer 124 and 125, and resistors 130 through 137. The inverting input of op-amp 114 is connected to the PB− line 110 through resistor 132. One end of current sensing resistor 130 is also connected to the PB− line 110 while the other end provides the PBRTN voltage on line 111. This line is also connected to the URCOM line. Resistors 131 and 134 are connected in parallel between the PBRTN line 111 and the non-inverting input of op-amp 114. The UR voltage is applied across op-amp 114. Capacitor 120 is connected between the inverting input and the output of op-amp 114, while resistor 133 and potentiometer 124 are connected in series between the same pins. The output of op-amp 114 is connected to the input of isolation amplifier 116. The input side of amplifier 116 is connected across the UR voltage while the output side is connected across the 16 VC voltage. The ground of the input side of amplifier 116 is connected to line 111, while the ground of the output side is connected to the load ground. The output of isolation amplifier 116 provides the PBI signal, a voltage proportional to the current on the power bus. The input of isolation amplifier 118 is connected to the PB+ line 108 through resistors 135 and 136 connected in series, and to the PBRTN line 111 through capacitor 121. Resistor 137 and potentiometer 125 are also connected in series to the input of amplifier 118. The power and grounds of amplifier 118 are connected as for amplifier 116. The output of isolation amplifier 118 provides the PBV signal, which is a voltage proportional to the power bus voltage. As indicated above, the DCON signal is passed through without change.

The power bus current sensing circuit 115 functions as follows. Resistor 130 is a current sensing resistor which feeds op-amp 114, which is connected in a difference amplifier arrangement. Resistors 131 and 134 form a voltage divider which slightly attenuates the signal into the non-inverting input. Resistor 133 in series with potentiometer 124 form the feedback resistor for the op-amp 114. Since the gain through the non-inverting input is 1 plus the gain through the inverting input, the value of resistor 134 is picked to make the gain through both inputs equal. Since this value depends on the feedback network, potentiometer 124 is added to tune out any effects of tolerance variations in the resistors and isolation amplifier. Capacitor 120 gives the network a low-pass filter response to remove any noise. Isolation amplifier 116 changes the signal reference from the line side to the load side and produces the signal PBI which is input to the power control module to be used in the calculation of the power, V×I, which is used in the calculation of $V_t$ and applied to LED 26.

The power bus voltage sensing circuit 117 functions as follows. Resistors 135 and 136 in combination with resistor 137 and potentiometer 125 form a voltage divider that applies a fraction of the power bus voltage to isolation amplifier 118. Resistors 135 and 136 cannot be combined into a single resistor because the voltage rating of a single resistor would be exceeded. Potentiometer 125 provides a trim adjustment for the voltage divider and is used to compensate for errors due to resistor tolerances and gain errors in isolation amplifier 118. Isolation amplifier 118 changes the signal reference from the line side to the load side and produces the signal PBV which is applied to the power control module to be used in the calculation of the power, V×I, which is used in the calculation of $V_t$ and applied to the LED display 26.

The power bus voltage, PB+, is connected to the DC/DC converter module 20. The DC/DC converters in the preferred embodiment are hybrid circuits, though they may be made from discrete components or be on a single chip. In any case the DCON signal provides a control signal to switch the DC/DC converters on and off.

A block diagram of the power control module 22 and front panel 24 is shown in FIG. 5. Power control module 22 includes a multiplexer 140, an analog to digital converter 142, and a microprocessor 144 having an associated clock 146. The various analog data signals, such as PBV and PBI, are applied to multiplexer 140. The clock 146 provides timing signals to microprocessor 144, which at predetermined times selects one of the analog inputs of the multiplexer 140 to be fed into A to D converter 142. The analog signal is digitized in the A to D converter 142 and applied to microprocessor 144, which reads the signal, adjusts it for various factors such as drifts in the ground reference voltage, and uses it in accordance with its programming.

Preferably, the LED display 26 is a high efficiency, red, four character, 5×7 dot matrix, alphanumeric LED display which automatically displays whatever ASCII character that is sent to it in ASCII code.

3. Composition of Parts

In the preferred embodiment of the invention, LED display 26 is a Siemans PD 2435 chip, rectifiers 32 and 34 are 1N4002X4 diode bridges, rectifier 56 is a BR256, transistors 58 and 60 are 2N2222's, SCRs 62, 64, 66, and 68 are 2N6398's, opto-triacs 72 and 74 are MOC3023's, opto-triacs 70 and 76 are MOC3043's, Zener diodes 36 and 38 are 1N5930A's, diodes 80 and 82 are 1N4002's, op-amp 114 is an LM607A, isolation amps 116 and 118 are ISO-122P's, multiplexer 140 is built-up from several chips, preferably 4051's, A to D converter 142 is an AD7579, microprocessor 144 is a Z84C0008, capacitor 40 is 2200 μfarad, capacitors 41, 42, and 43 are 470 μfarad, capacitors 84, 85, and 86 are 0.01 μfarad, capacitors 87 and 88 are 6×560 μfarad, capacitors 120 and 121 are 0.1 μfarad, resistors 89 and 102 are 20 ohms, resistors 90 and 92 are 200 ohms, resistors 91, 93, 94, and 95 are 1 K, resistors 96 and 99 are 1.5 K, resistors 97, 98 and 137 are 10 K, resistors 100 and 101 are 39 K, resistor 130 is 0.005 ohm, resistors 131 and 132 are 100 ohm, resistor 133 is 8.25 K, resistor 134 is 9.31 K, resistors 135 and 136 are 1 M, and potentiometer 124 and 125 are 2 K.

4. Function and Features

Figure 7A:
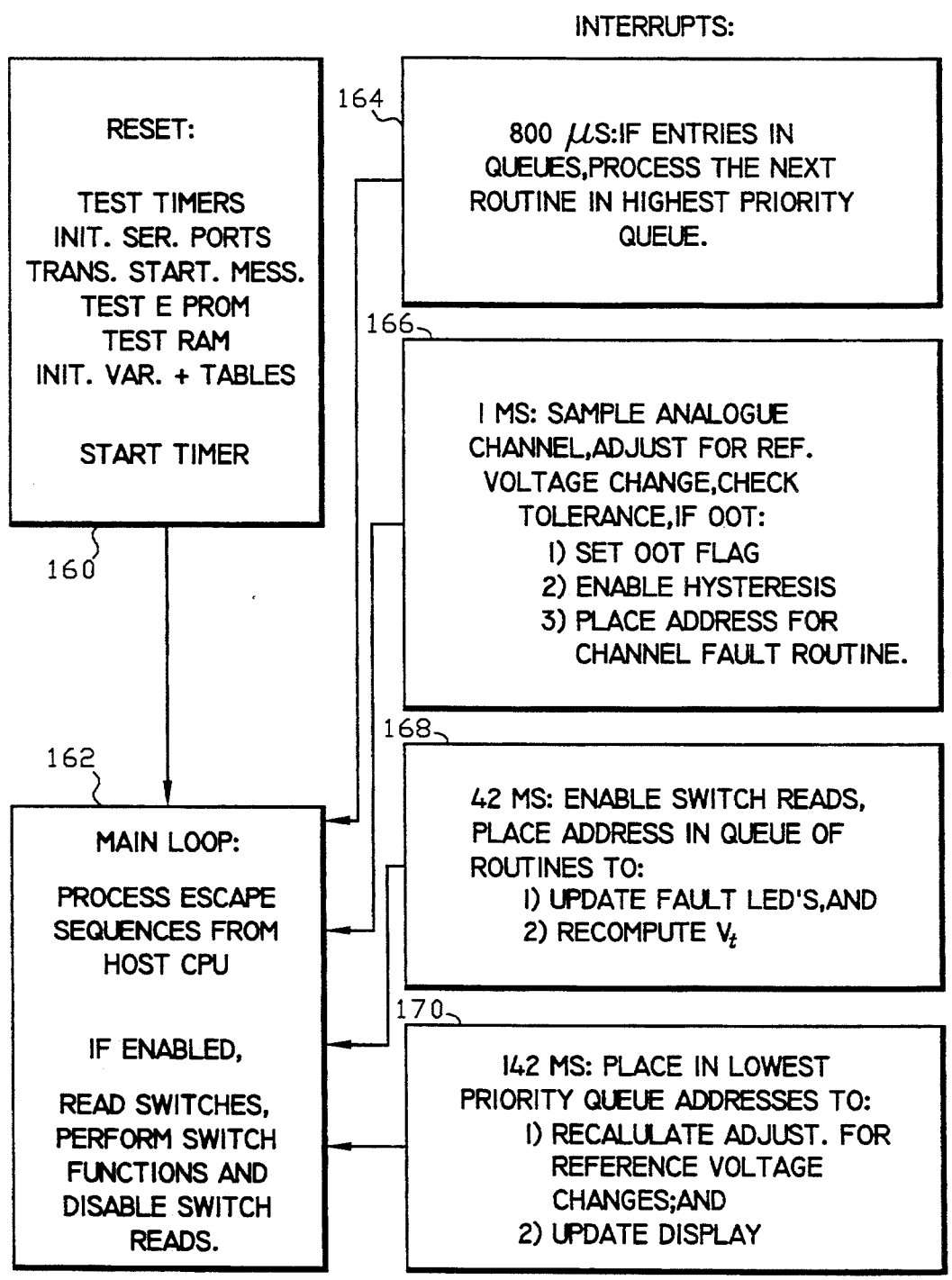
FIG. 7A is a block diagram showing the structure of the firmware of the system of FIG. 1.

In the preferred embodiment of the invention, the programming of microprocessor 144 is via firmware. The structure of the firmware is shown in FIG. 7A. The general structure is in the form of an initial group of operations 160 that are run through each time the system is plugged in or reset, a main loop set of operations 162, and a series of interrupts: 800 microsecond interrupts 164, 1 millisecond interrupts 166, 42 millisecond interrupts 168, and 142 millisecond interrupts 170. The 800 microsecond interrupt 164 comprises a series of queues arranged in order of priority. Each queue may have one or more entries, which are ordered (within the queue) in the order in which they were placed in the queue, that is within each queue the processing is FIFO. Each entry in a queue is in the form of an address. Once each about 800 microseconds, the microprocessor goes to the interrupt 164, and if there are any entries it processes the oldest entry in the highest priority queue. Each of the interrupts 166, 168, and 170 perform specific tasks and places an address in one of the queues in the 800 microsecond interrupt for a particular routine, if the task requires it. This manner of organization of programming, i.e. an initialization set of operations, a main loop, and interrupts that are organized and processed in queues is well-know in the art, and thus we shall not discuss it further, but rather discuss in detail the particular functions that are performed.

Except for the initialization of the variables and tables, the initialization operations 160 are conventional and will not be discussed in detail. The initialization of the variables and tables includes the initialization of $V_t$ and the constants to be used in the calculation of $V_t$. $V_t$ is initialized at about 200 volts in the units used by A to D converter 142. The calculation of the constants is shown in the flow chart of FIG. 6A. First $V_0$, which as discussed above is a constant for the system, is read and converted to units utilized by the A to D converter. This conversion to these units is done so that the constant is in the form most readily usable by the microprocessor. Next $V_0^2$ is calculated and saved. Then $K = 2t_h/C$ is calculated, converted to analog to digital converter units, and saved. These constants are now ready for use in real time calculations of $V_t$. After the timer is started, the main loop is entered and the interrupts begin.

In the main loop the escape sequences from the host CPU are processed in a conventional manner, and then the various switches on the front panel are read and the required tasks are performed. As part of these tasks, the power switch is read and the power on sequence as discussed above is performed if the switch has been turned on since the last time it was read.

Figure 7B:
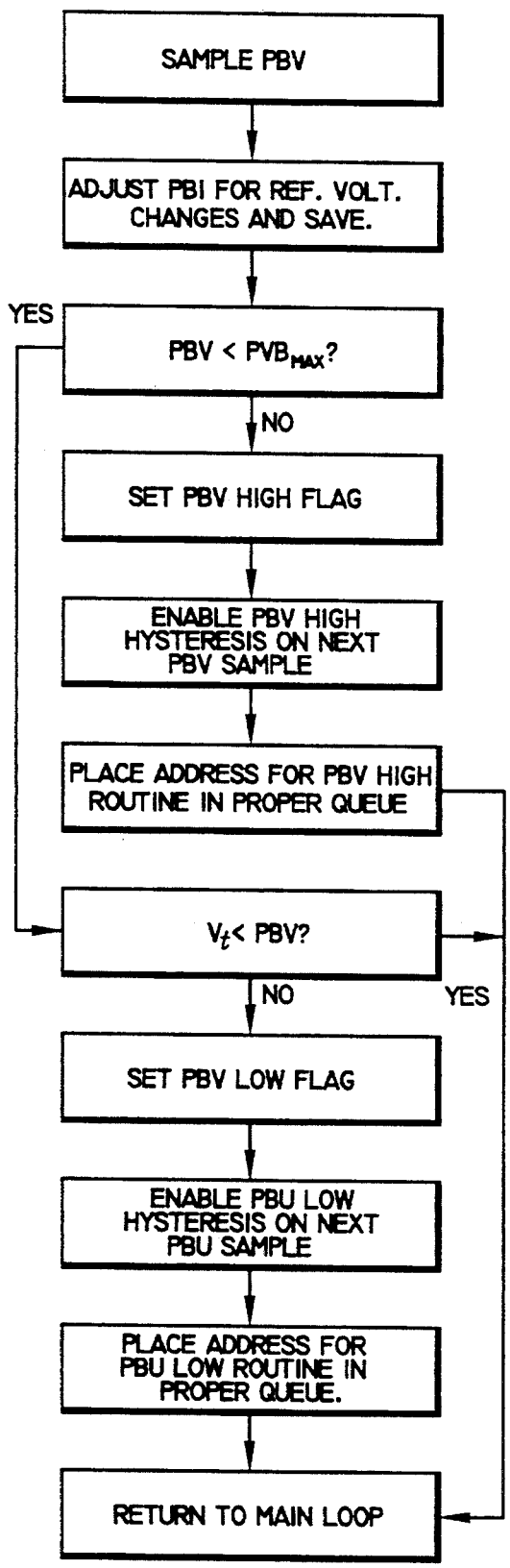
FIG. 7B is a flow chart showing details of the 1 ms interrupt function referred to in FIG. 7A, for the PBV channel.
Figure 7C:
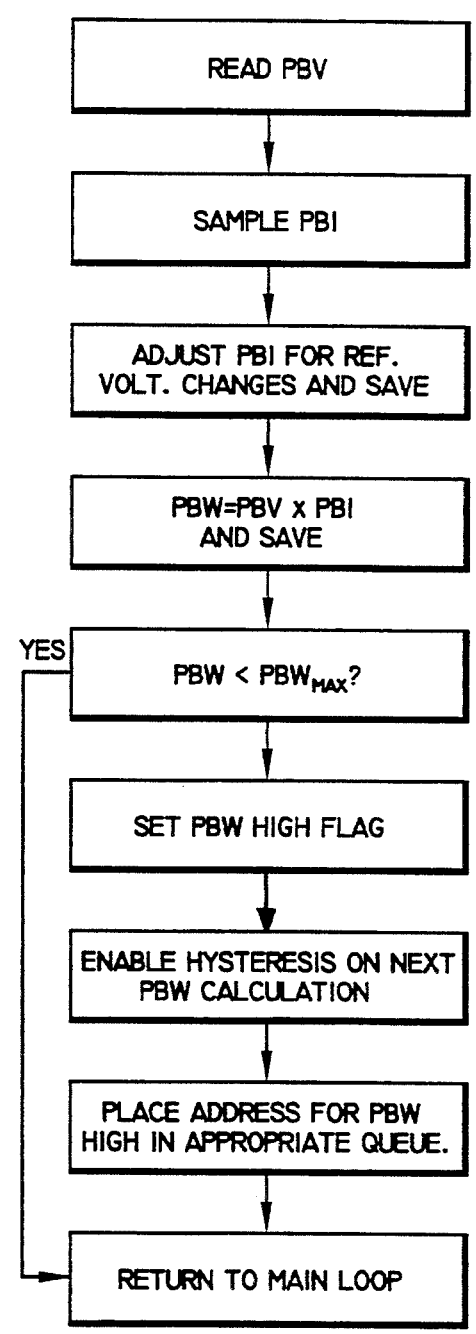
FIG. 7C is a flow chart showing details of the 1 ms interrupt function for the PBI channel.

Every approximately 1 millisecond, the analog channel is sampled according to an analog channel queue. This queue is set up so that the PBV signal is sampled about every 4 milliseconds and the PBI channel is sampled about every 11 milliseconds. The sampling and tasks related to checking for out-of-tolerance (OOT) parameters are described generally in interrupt box 166 and shown in detail in FIG. 7B for PBV and FIG. 7C for PBI. For PBV, the signal PBV is sampled then adjusted for the reference voltage changes and any other adjustments that may be required, then saved. PBV then it is compared to $V_{MAX}$, which is a voltage above which the D/C converter module 20 will not function properly. If PBV is not less than Vmax, then the PBV high flag is set, the PBV high hysteresis function is enabled, the address for the PBV high routine is placed in the appropriate queue, and the system returns to the main loop. The use of an hysteresis function in general involves the altering of the value to which the variable is compared in subsequent samples so that the system does not oscillate on and off. That is, in the case of PBV, the next $V_{MAX}$ would be adjusted lower so that PBV would have to fall significantly to meet the threshold value. The use of hysteresis is well-known in the art and thus will not be discussed further herein. If PBV is less than $V_{MAX}$, PBV is then compared to $V_t$, and if it not greater than $V_t$, the PBV low flag is set, PBV low hysteresis is enabled for the next sample on the PBV channel, and the address for the PBV low routine is placed in the appropriate 800 millisecond queue, then the system returns to the main loop. If PBV is greater than $V_t$, then the system returns to the main loop at once. It is noted that since these interrupt functions are run about every four milliseconds, their initial runs will take place while the power is still rising in the capacitors 87 and 88. Thus they will catch an error such as the system being plugged into too high a voltage and shut down the power supply 17 before the voltage on the capacitors reaches too high a value. A preferred embodiment of the PBI channel 1 millisecond routine is shown in FIG. 7C. First PBV is read, PBI is sampled and adjusted, then PBW=PBV ×PBI is calculated and saved. PBW is then compared to $PBW_{MAX}$, and if it is too high, the PBW high flag is set, PBW high hysteresis is set, the address for the PBW high flag is placed in the appropriate queue, and the system returns to the main loop. If PBW is not high the system returns immediately to the main loop.

About every 42 milliseconds the 42 millisecond interrupt 168 is run, which interrupt includes the recomputing of $V_t$. A flow chart of this operation is shown in FIG. 6B. Both PBV and PBI are read out as 10 bit binary integers. Then, PBW=PBV×PBI is calculated, which results in a 20 bit binary integer. The least significant 8 its are stripped and the resulting 12 bit product is saved. Then $V_t = (K \times PBW + V_0^2)^{0.5}$ is calculated, saved, and the system returns to the main loop.

Referring to the 142 millesecond interrupt 170, about every 142 milliseconds the address for the routine for recalculation of the adjustments, such as for reference voltage changes, and the address for the routine for updating the display are placed in the lowest priority queue. The routine for updating the display includes updating the power in watts shown on the LED 26. This routine simply consists of outputting the power PBW, calculated and saved in the above routines, to LED 26 in ASCII code.

As indicated above, the queues into which the addresses for routines are put are processed about every 800 microseconds, so any of the out-of-tolerance routines are processed almost immediately after they are placed in a queue. The power bus high queue is the highest priority queue since the DC/DC converter may be damaged above 400 volts. If the power bus high or low is in a queue, the power down sequencing is as follows: The backplane sequencing is performed, /AC-FAIL is driven active, the system delays approximately 4 milliseconds, /SYSRESET is driven active, power is removed from the disk drives, DCON is dropped to turn the DC/DC convertors off, PBON is dropped to turn the power supply and power bus voltage off, and a one-second delay is initiated to be completed before the next attempted power up. If over power (PBW high flag) is in the queue, the system shuts down similarly, and won't come back on until the power switch 25 on front panel 24 is pressed. If the PBV low flag is set, the system is shut down as discussed in the Overview Section above.

A feature of the invention is that of active in-rush current limiting and over-voltage protection. When first turned on, the power supply has resistors 89 and 102 in series with the filter capacitors 87 and 88 and that limits the initial current surge to a level that will not trip breakers or blow fuses. The power control module 22 monitors the voltage on the filter capacitors via the PBV signal and checks first for an over-voltage condition which could happen if the power supply has been plugged into the wrong voltage. If such a condition is detected, the supply is switched off immediately to prevent damage. Secondly, the power control module 22 checks for the power bus reaching a certain voltage indicating that the filter capacitors 87 and 88 are nearly charged. At this time the LMTOFF signal is asserted which causes the current limiting resistors 89 and 102 to be shorted to provide a low impedance path between the rectifier 56 and the capacitors, and the capacitors quickly come up to full charge. The current surge is greatly minimized however, since the capacitors 87 and 88 are close to full charge. Only then are the DC/DC converters 20 switched on to provide the power to the backplane.

Another feature of the invention is the use of SCRs instead of solid-state relays or triacs. Commercially available solid-state relays and triacs are not rated for 400HZ operation, and may malfunction if used at 400Hz. Elimination of these components means that the power supply can be guaranteed to operate reliably from 50 HZ to 400 HZ.

The availability of the instantaneous power used by the computer electronics assembly 12 is another feature of the invention. This comes about because the power is calculated for use in the determination of $V_t$. It has turned out that this quantity is very useful. When displayed on the front panel using LEDs that are updated every approximately 142 milliseconds, the user, when compared to typical human reaction times, has an essentially instantaneous readout of the system power. It has been found that when this information is available, users develop an additional dimension of interaction with the computer that prevents some energy use related problems from arising and allows many other problems to be solved much more readily than previously.

A further feature of the invention is the use of a microprocessor 144 in the power control module 22. The microprocessor monitors the voltage across the filter capacitors 87 and 88 to turn off the power supply if an over-voltage condition occurs, determines when the power bus reaches a predetermined voltage after turn on and then switches to a low impedance path between the rectifier 56 and capacitors 87 and 88, and switches on the DC/DC converters 20.

An important feature of the invention is the use of a variable low voltage threshold. This allows all the significant information in determining the optimal conditions under which to initiate the power down sequence to be considered. A related feature is that all this information is included in a single parameter greatly simplifying the monitoring and power down function as compared to prior art systems. Further, it allows one to confidently keep the system on in many instances when it would otherwise have been turned off while knowing that the system power down will be provided in time to orderly save data and perform other necessary functions. Thus the ability to ride through temporary AC power losses is optimized.

There has been described a novel electronics system providing optimal power failure monitoring and many other advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that it is seen to be possible to include all the important variables related to system monitoring and power down in a voltage threshold, it is evident that other single electronic parameters that are easily handled may be used. Other software or firmware approaches may be used. Or other electronic parts may be substituted for the various parts described. A greater or lesser number of electronic components may be used. Consequently, the invention is to be construed as embracing each and every novel feature and novel combination of features present in and/or possessed by the described.

What is claimed is:

1. An electronic system having a power failure monitoring function, said system comprising:
   monitoring means for monitoring DC power parameters of the electronic system, said DC power parameters including system voltage;
   means operatively associated with said monitoring means for determining an instantaneous variable parameter from said DC power parameters;
   means for periodically determining a threshold voltage, said threshold voltage being derived at least in part from said instantaneously variable parameter of said system;
   comparison means for periodically comparing said system voltage to said threshold voltage and for determining whether said system voltage is less than said threshold voltage; and
   signal means operatively associated with said comparison means for outputting a signal indicative of an impending power failure when said system voltage is less than said threshold voltage.

2. An electronic system as in claim 1 wherein said variable parameter is a power being used by the system.

3. An electronic system as in claim 1 wherein said variable parameter is a current being used by said system.

4. An electronic system as in claim 1 wherein said variable parameter is a voltage being supplied to said system.

5. A system as in claim 1 further comprising a DC power supply having at least one filter capacitor, and wherein said threshold voltage is derived at least in part from energy stored in said at least one filter capacitor.

6. A system as in claim 1 wherein said threshold voltage is derived at least in part from a time for the system voltage to stay above a predetermined voltage after a power failure.

7. A computer system having a power failure monitoring function said computer system comprising:
   a digital memory;
   a digital processor communicating with said digital memory;
   parameter monitoring means for monitoring a system power parameter;
   means operatively associated with said parameter monitoring means or determining an instantaneous variable parameter from said system power parameter;
   means operatively associated with said digital processor for periodically determining a threshold power parameter, said threshold power parameter being derived at least in part from said instantaneous variable power parameter of said computer system;
   comparison means operatively associated with said digital processor for periodically comparing said system power parameter to said threshold power parameter and for determining whether said system power parameter is less than said threshold power parameter; and
   signal means operatively associated with said digital processor for outputting a signal indicative of an impending power failure when said system power parameter is less than said threshold power parameter.

8. A computer system as in claim 7 further comprising a DC power bus connected to said parameter monitoring means, and wherein said threshold power parameter is derived from a current on said DC power bus.

9. A computer system as in claim 8 wherein said threshold power parameter is derived at least in part from a voltage on said DC power bus.

10. A computer system as in claim 9 further comprising a DC power supply connected to said DC power bus and having at least one filter capacitor, and wherein said threshold power parameter is derived at least in part from the energy stored in said at least one filter capacitor.

11. A system as in claim 7 wherein said threshold power parameter is derived at least in part from a time desired for the system voltage to stay above a predetermined voltage after a power failure.

12. A computer system as in claim 7 further comprising display means connected to said digital processor for displaying said system power parameter monitored by said parameter monitoring means.

13. A computer system as in claim 12 further comprising a DC power bus and said parameter monitoring means monitors a voltage on said DC power bus and said display means displays said voltage.

14. A computer system as in claim 13 wherein said parameter monitoring means monitors a current on said DC power bus and said display means displays said current.

15. A computer system as in claim 13 wherein said parameter monitoring means monitors a power used at said DC power bus and said display means displays said power in watts.

16. A computer system as in claim 12 wherein said computer includes a housing and said display means comprises a LED display mounted on said housing.

17. A method of providing a power failure anticipatory function in an electronics system comprising the steps of:

monitoring a system parameter;

measuring an instantaneous variable parameter from said system parameter;

periodically calculating a threshold power parameter, said threshold power parameter being derived at least in part from said instantaneous variable parameter;

comparing said system parameter to said threshold power parameter; and outputting a signal indicative of an impending power failure when said compared system parameter is less than said threshold power parameter.

18. A method as in claim 17 wherein said electronics system includes a computer electronics assembly having a power bus and said monitoring a system parameter comprises monitoring a voltage on said power bus.

19. A method as in claim 18 wherein said instantaneous variable parameter is a current on said power bus.

20. A method as in claim 17 wherein said step of periodically calculating a threshold power parameter comprises periodically calculating a threshold voltage which is derived at least in part from a time desired for the system voltage to stay above a predetermined voltage after a power failure.

* * * * *